United States Patent
Yen et al.

(10) Patent No.: US 10,309,582 B2
(45) Date of Patent: Jun. 4, 2019

(54) SUPPORTING MODULE

(71) Applicant: SYNCMOLD ENTERPRISE CORP., New Taipei (TW)

(72) Inventors: Ching-Hui Yen, New Taipei (TW); Jen-Yi Lee, New Taipei (TW); Ming-Chih Shih, New Taipei (TW)

(73) Assignee: SYNCMOLD ENTERPRISE CORP., New Taipei (TW)

(*) Notice: Subject to any disclaimer, the term of this patent is extended or adjusted under 35 U.S.C. 154(b) by 0 days.

(21) Appl. No.: 15/956,142

(22) Filed: Apr. 18, 2018

(65) Prior Publication Data

US 2018/0372266 A1  Dec. 27, 2018

Related U.S. Application Data

(60) Provisional application No. 62/524,716, filed on Jun. 26, 2017.

(51) Int. Cl.
| | |
|---|---|
| *F16M 13/02* | (2006.01) |
| *H05K 5/02* | (2006.01) |
| *F16H 25/24* | (2006.01) |
| *H05K 5/00* | (2006.01) |

(52) U.S. Cl.
CPC ......... *F16M 13/02* (2013.01); *F16H 25/2454* (2013.01); *H05K 5/0234* (2013.01); *F16M 2200/044* (2013.01); *F16M 2200/06* (2013.01); *H05K 5/0017* (2013.01)

(58) Field of Classification Search
CPC ............. F16M 13/02; F16M 2200/044; F16M 2200/06; F16H 25/2454; H05K 5/0234; H05K 5/0017

USPC ...... 248/917, 923, 922, 919, 291.1, 66, 470, 248/351; 403/84, 92, 93, 96, 98, 103, 403/104
See application file for complete search history.

(56) References Cited

U.S. PATENT DOCUMENTS

| | | | | |
|---|---|---|---|---|
| 4,149,430 A | * | 4/1979 | F'Geppert | F16D 59/02 477/23 |
| 6,021,985 A | * | 2/2000 | Hahn | A47B 21/0314 248/279.1 |
| 7,669,287 B2 | * | 3/2010 | Lee | G06F 1/1616 16/327 |
| 7,731,137 B2 | * | 6/2010 | Lee | F16M 11/10 248/157 |

(Continued)

*Primary Examiner* — Muhammad Ijaz
(74) *Attorney, Agent, or Firm* — Muncy, Geissler, Olds & Lowe, P.C.

(57) ABSTRACT

Disclosed is a supporting module for a display device, which includes a fixing seat, a pivot lever, a slider and a spring. The pivot lever and the slider constitute a screw transmission mechanism with a varied helix angle. The lifting and lowering of the display device can cause screw motion between the pivot lever and the slider and thus induces the linear movement of the slider according to the axial advance of the varied helix angle. Accordingly, the displacement of the slider causes different degrees of deformation in the spring, resulting in different spring resilience forces on the slider. By the screw transmission mechanism with the varied helix angle, different spring resilience forces can be further converted into different resistance torques to provide appropriate supporting force in coordination with the variation of the gravity torque of the display device.

14 Claims, 13 Drawing Sheets

(56) References Cited

U.S. PATENT DOCUMENTS

| | | | | |
|---|---|---|---|---|
| 8,196,875 | B2* | 6/2012 | Lien | F16M 11/10 |
| | | | | 248/121 |
| 8,199,473 | B2* | 6/2012 | Zhou | F16M 11/10 |
| | | | | 248/917 |
| 2008/0101853 | A1* | 5/2008 | Huang | F16C 11/02 |
| | | | | 403/92 |
| 2009/0064460 | A1* | 3/2009 | Tang | F16M 11/10 |
| | | | | 16/322 |
| 2010/0059637 | A1* | 3/2010 | Zhou | F16M 11/10 |
| | | | | 248/122.1 |
| 2010/0084522 | A1* | 4/2010 | Zhou | F16M 11/2092 |
| | | | | 248/124.1 |
| 2014/0063750 | A1* | 3/2014 | Mau | G06F 1/1601 |
| | | | | 361/728 |
| 2018/0372266 | A1* | 12/2018 | Yen | F16M 13/02 |

* cited by examiner

SUPPORTING MODULE

CROSS REFERENCE TO RELATED APPLICATION

This application claims the benefit of filing date of U.S. Provisional Application Ser. No. 62/524,716 filed Jun. 26, 2017. The entirety of said Provisional Application is incorporated herein by reference.

BACKGROUND OF THE INVENTION

1. Field of the Invention

The present invention relates to a supporting module and, more particularly, to a supporting module for providing varied supporting torque by virtue of varied helix angle.

2. Description of Related Art

A conventional supporting device typically includes a fixing seat, a connecting arm and a swivel joint. The connecting arm has one end for mounting a screen and the other end pivotally attached to the fixing seat by the swivel joint. Accordingly, the connecting arm can pivot with respect to the fixing seat for adjustment of the screen height. For balancing with the downward torque caused by the screen weight, the swivel joint generally includes a torsional spring to provide a supporting torsion so that the screen can be stopped at any desired height with respect to the fixing seat. However, during lifting and lowering of the screen, the torque caused by the screen weight would be varied non-linearly, but the supporting torsion provided by the torsional spring linearly varies and cannot balance with the torque caused by the screen.

SUMMARY OF THE INVENTION

An objective of the present invention is to provide a supporting module for a display device, which is characterized by the combination of a spring and a screw transmission mechanism with a varied helix angle. The screw transmission mechanism is constituted by a pivot lever and a slider, and the linear movement of the slider would cause the spring to generate return force. Further, the rectilinear return force can be converted into axial resistance torque through the screw transmission mechanism. By the design of the varied helix angle, the supporting module of the present invention can provide appropriate support to balance with the varied downward torque caused by the weight of the display device. As a result, the display device can be stopped at any desired height.

In accordance with the foregoing objectives, the present invention provides a supporting module for a display device, the supporting module including: a fixing seat, having a guide structure, wherein the guide structure defines a linear path; a pivot lever, having a shaft and an arm, wherein (i) the shaft is rotatably connected to the fixing seat and has a central axis parallel to the linear path, (ii) the arm is connected to the shaft and used for mounting the display device, and (iii) the arm is configured to be pivotable about the central axis of the shaft and capable of bringing the shaft into synchronous rotary motion; a slider, being sleeved on the shaft, wherein (i) the slider and the shaft constitute a screw transmission mechanism with a varied helix angle, (ii) the slider is brought into linear movement along the linear path with respect to the shaft when the arm is forced to induce rotary motion of the shaft, and (iii) the linear movement of the slider depends on axial advance corresponding to the varied helix angle; and a spring, having a mobile end and an immobile end, wherein the mobile end moves with the slider and the immobile end keeps stationary when the slider moves along the linear path, so that the linear movement of the slider causes different degrees of deformation in the spring, resulting in different spring resilience forces on the slider, and the different spring resilience forces are further converted into different resistance torques through the screw transmission mechanism so as to stop the display device at any desired height.

In the supporting module of the present invention, the spring may be a tension spring and cooperate with the screw transmission mechanism having the varied helix angle to provide elastic force as adequate supporting force for balancing with the weight of the display device. Thereby, the display device can be stopped at any desired height. Preferably, the angle variation of the varied helix angle corresponds with the gravity torque variation caused by lifting or lowering of the display device, so that the elastic force provided by the spring can balance with the gravity torque caused by the display device. Specifically, as the gravity torque would non-linearly vary during lifting or lowering of the display device, the varied helix angle preferably is designed to induce the spring to provide non-linearly varied elastic forces. Additionally, when the arm is pivoted from a lifted state to a lowered state, the downward torque caused by the weight of the display device would gradually increase and then gradually decrease corresponding to the variation of effective moment arm, and thus the deformation of the spring preferably gradually increases and then gradually decreases. Accordingly, when the arm is pivoted from a lifted state to a horizontal state, the deformation of the spring preferably gradually increases with the displacement of the slider to generate arisen supporting torque for balancing with the increased downward torque. On the contrary, when the arm is pivoted from the horizontal state to a lowered state, the deformation of the spring preferably gradually decreases to generate reduced supporting torque for balancing with the decreased downward torque.

In the present invention, one of the shaft and the slider can be formed with at least one first thread groove and at least one second thread groove, whereas the other can be provided with at least one first ball and at least one second ball. The first thread groove and the second thread groove may have the same thread path. When the shaft rotates, the first ball and the second ball move along the first thread groove and the second thread groove, respectively. Preferably, the starting ends of the first thread groove and the second thread groove are spaced apart from each other by 180 degrees in a circumferential direction. Likewise, the first ball and the second ball preferably are spaced apart from each other by 180 degrees in a circumferential direction. More specifically, the slider can have a first shell, a second shell, at least one first ball and at least one second ball, whereas the shaft has an exterior surface formed with at least one first thread groove and at least one second thread groove. The first ball and the second ball are disposed at the first shell and the second shell, respectively. The first shell and the second shell are engaged with each other and sleeved on the shaft. Alternatively, the slider can have a first shell, a second shell and an interior surface formed with at least one first thread groove and at least one second thread groove, whereas the shaft is provided with at least one first ball and at least one second ball. In this alternative aspect, the first shell and the second shell are engaged with each other and sleeved on the shaft, and the first thread groove and the second thread groove extend across a joint boundary between the first shell and the second shell. Accordingly, the shaft and the slider can constitute a ball-screw transmission mechanism. When the shaft rotates, the first ball and the second ball move along the first thread groove and the second thread groove, resulting in linear movement of the slider with respect to the shaft. Additionally, the slider may further have a sleeve that is sleeved on the first shell and the second shell to avoid separation between the first shell and the second shell.

In the present invention, each of the first thread groove and the second thread groove preferably has a main segment and a turning segment. The turning segment has a thread direction opposite to that of the main segment. Accordingly, the elastic force provided by the spring can correspond with the variation of gravity torque during the change in the position of the display device between a lifted location and a lowered location. When the arm is pivoted from a lifted state to a horizontal state, the slider would rectilinearly move according to the main segment, resulting in non-linearly increasing of the elastic force provided by the spring. On the contrary, when the arm is pivoted from the horizontal state to a lowered state, the slider would rectilinearly move according to the turning segment, resulting in non-linearly decreasing of the elastic force provided by the spring.

In the present invention, the fixing seat preferably further has a base plate, a first lateral plate and a second lateral plate. The first lateral plate and the second lateral plate are erected on the base plate, and the shaft of the pivot lever extends through the first lateral plate, the slider, the spring and the second lateral plate in sequence. In a preferred embodiment of the present invention, the shaft of the pivot lever is rotatably connected to the first lateral plate and the second lateral plate, whereas the mobile end and the immobile end of the spring abut against the slider and the second lateral plate of the fixing seat, respectively.

In the present invention, the guide structure of the fixing seat may include a first guide rod and a second guide rod that extend through the slider along a direction parallel to the central axis of the shaft. Preferably, the first guide rod and the second guide rod each have two opposite ends connected to the first lateral plate and the second lateral plate, respectively. Accordingly, the slider can linearly move along the first guide rod and the second guide rod.

The foregoing and other objects, advantages, and novel features of the invention will become more apparent from the following detailed description when taken in conjunction with the accompanying drawings.

DETAILED DESCRIPTION OF THE PREFERRED EMBODIMENT

Hereafter, example will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
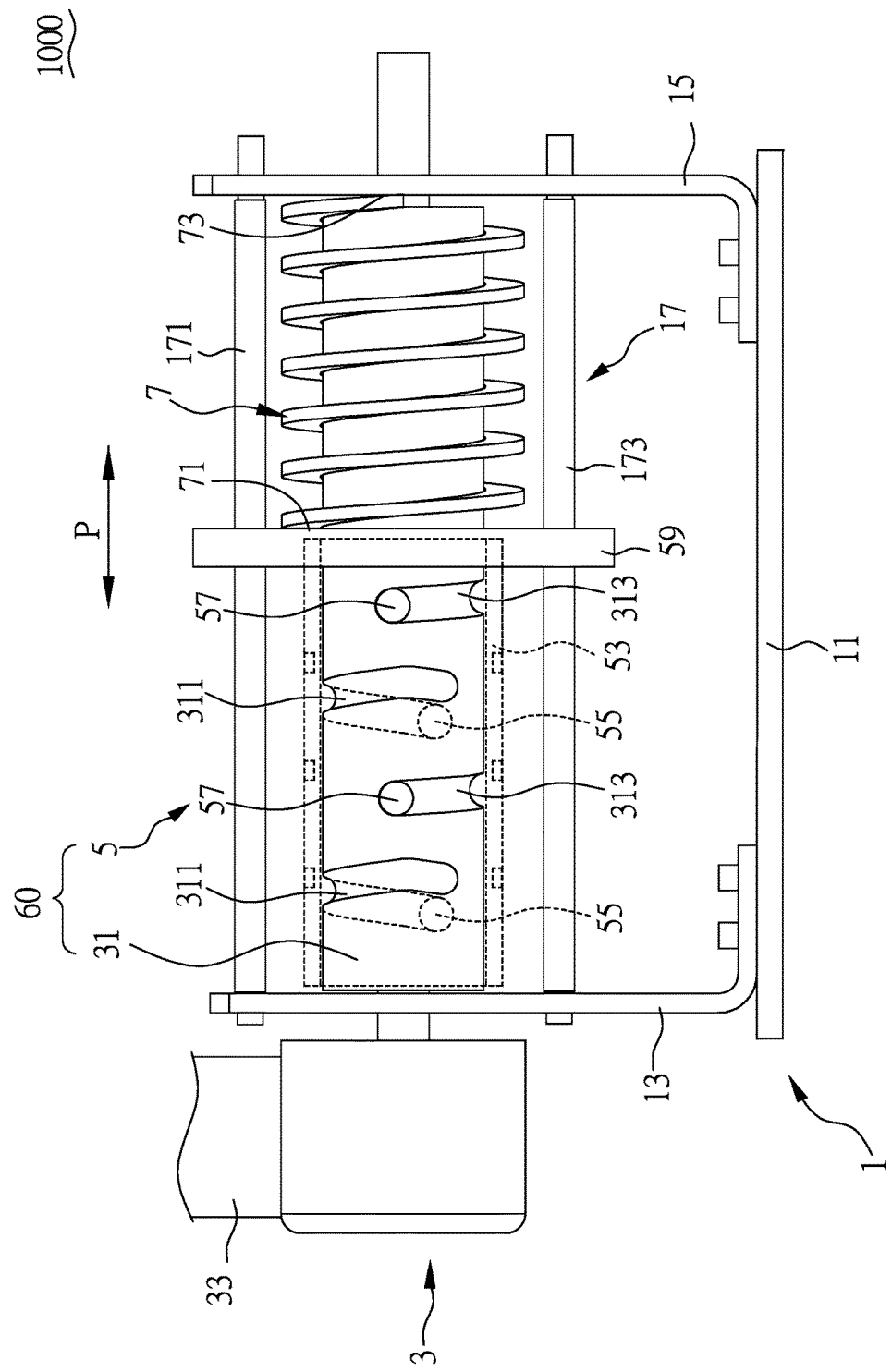
FIG. 1 is a side view of a supporting module in accordance with one embodiment of the present invention.
Figure 2:
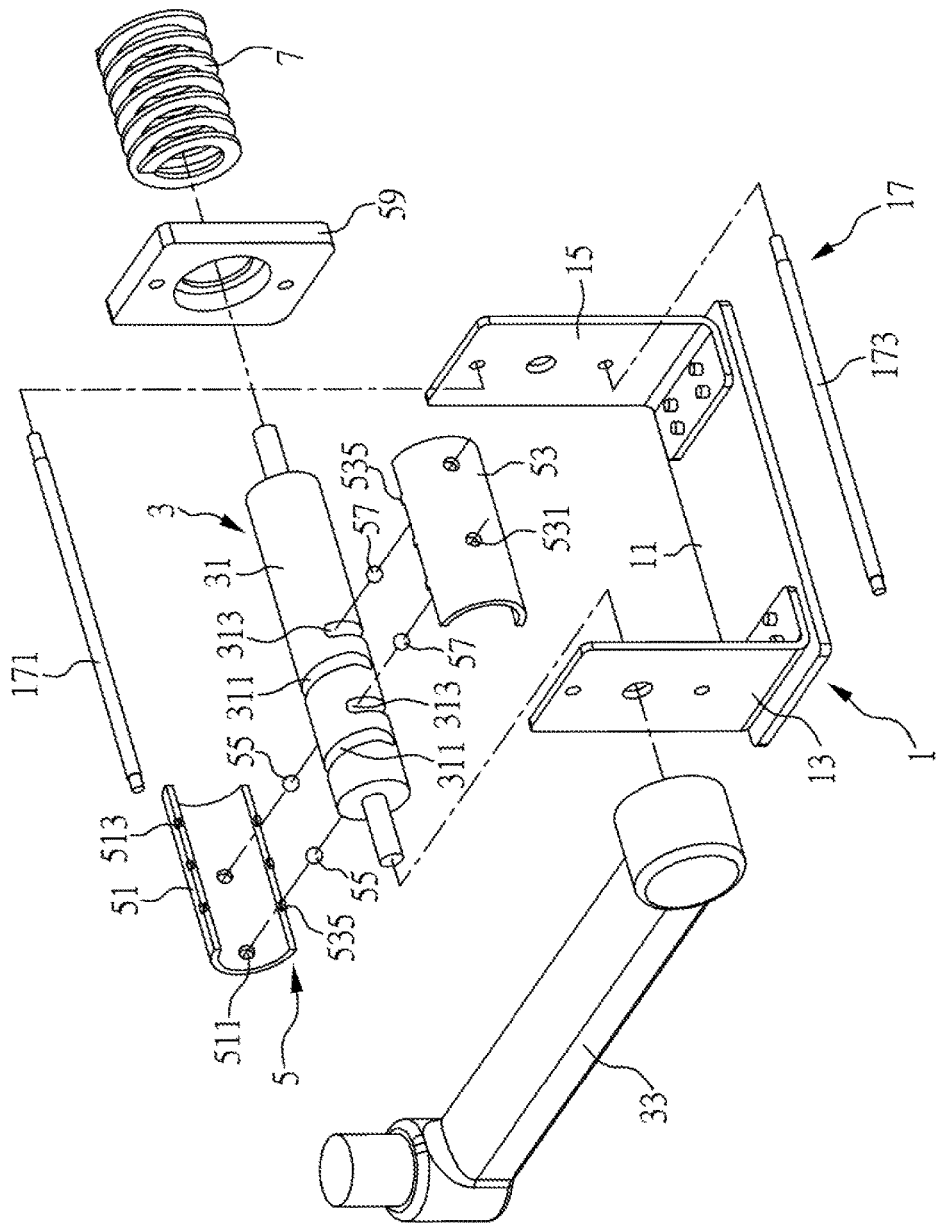
FIG. 2 is an exploded perspective view of a supporting module in accordance with one embodiment of the present invention.
Figure 8:
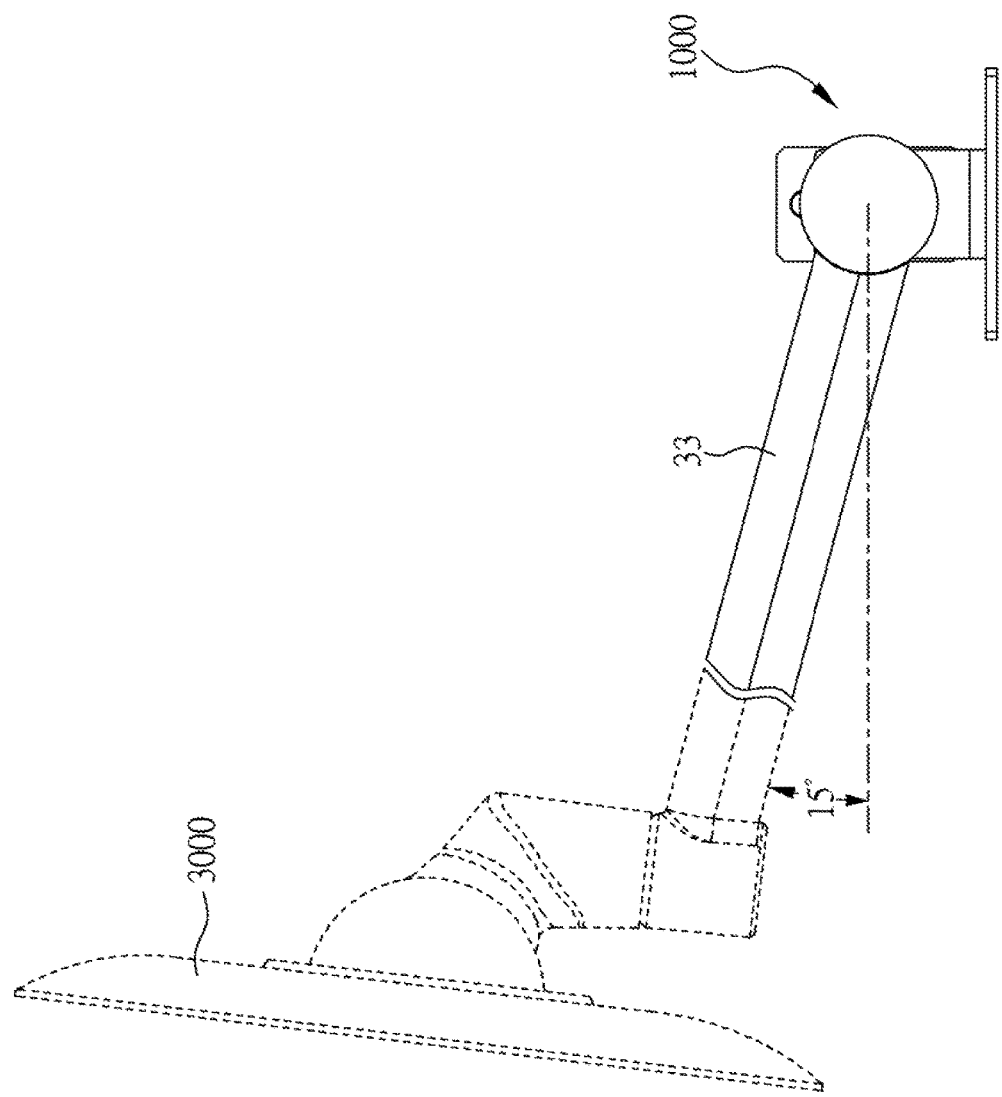
FIG. 8 is a side view of a display device on the supporting module adjusted to the highest position.
Figure 10:
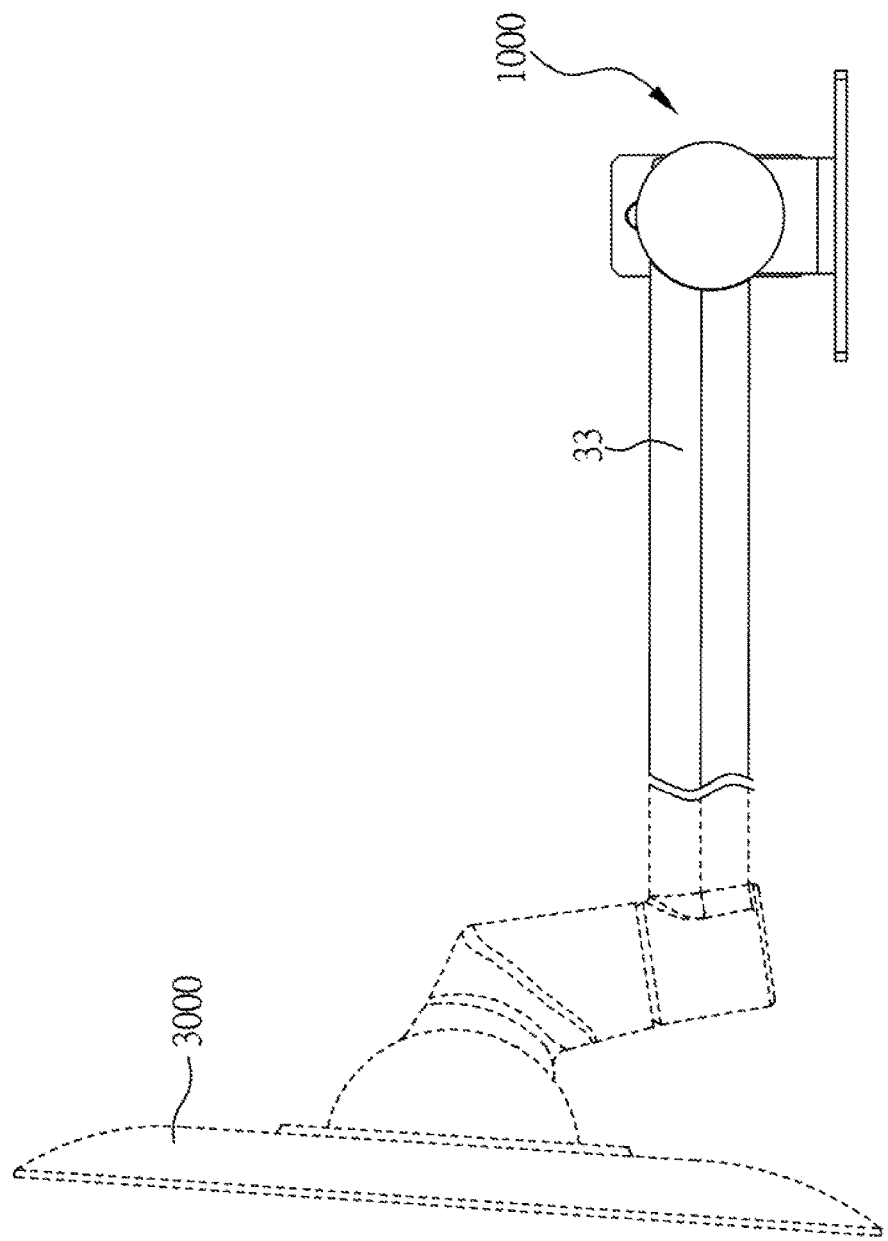
FIG. 10 is a side view of a display device on the supporting module adjusted to the horizontal position.
Figure 12:
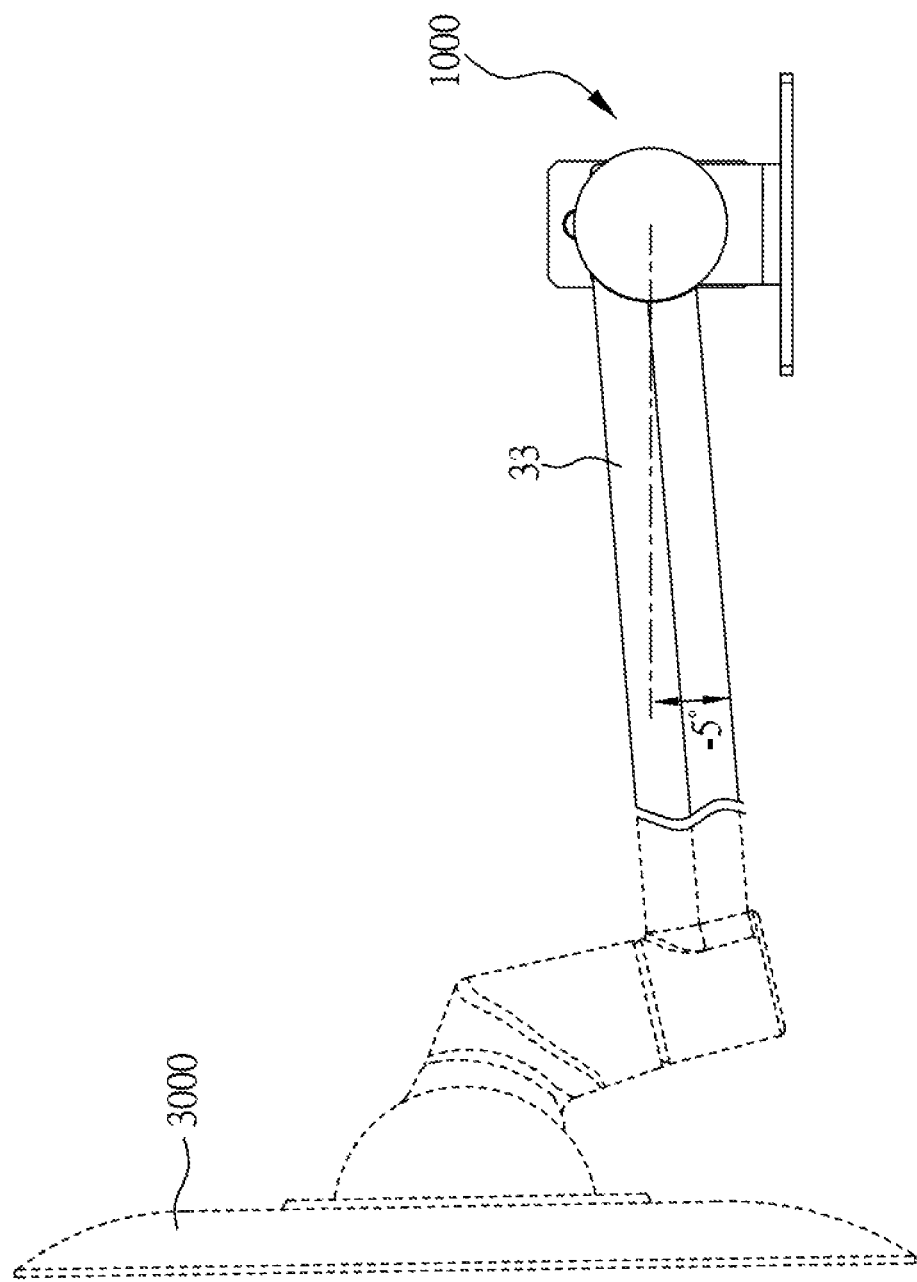
FIG. 12 is a side view of a display device on the supporting module adjusted to the lowest position.

Please refer to FIGS. 1 and 2, which are side and exploded perspective views of a supporting module 1000 in accordance with one embodiment of the present invention. The supporting module 1000 of this embodiment includes a fixing seat 1, a pivot lever 3, a slider 5 and a spring 7. The pivot lever 3 is pivotally fastened to the fixing seat 1 and configured to hold a display device 3000 (as shown in FIGS. 8, 10 and 12), and the slider 5 and the spring 7 are sleeved on a shaft 31 of the pivot lever 3. The shaft 31 and the slider 5 constitute a screw transmission mechanism 60 with a varied helix angle. Herein, the varied helix angle refers to a helix thread (curve) having a plurality of different helix angles. Different helix angles cause different axial displacement under the same rotation angle. When an arm 33 of the pivot lever 3 is forced to induce rotary motion of the shaft 31, the slider 5 would linearly move along a linear path P with respect to the shaft 31 in accordance with axial displacement corresponding to the varied helix angle. Accordingly, the displacement of the slider 5 causes different degrees of deformation of the spring 7, resulting in different spring resilience forces on the slider 5 and difference resistance torques on the pivot lever 3. As a gravity torque on the arm 33 caused by the weight of the display device 3000 non-linearly varies during pivot motion of the arm 33, the varied helix angle of the screw transmission mechanism 60 is preferably varied according to the variation of the gravity torque of the display device 3000. As a result, the elastic force provided by the spring 7 would balance with the downward torque caused by the display device 3000, so that the display device 3000 can remain at any desired height.

In this embodiment, a compression spring and a ball-screw transmission mechanism are used for exemplary illustration of the spring 7 and the screw transmission mechanism 60, respectively. The detailed structure of the supporting module and the association among main components in accordance with the present invention are further illustrated as follows.

The fixing seat 1 has a base plate 11, a first lateral plate 13, a second lateral plate 15 and a guide structure 17. The first lateral plate 13 and the second lateral plate 15 are fastened and erected on the base plate 11. The guide structure 17 includes a first guide rod 171 and a second guide rod 173, which are parallel to each other, extending through the slider 5, and fastened to the second lateral plate 15 to define a linear path P. As the guide structure 17 of the fixing seat 1 is used for limiting the motion of the slider 5 along the linear path P, the guide structure 17 of the fixing seat 1 is not restricted to the first guide rod 171 and the second guide rod 173 illustrated herein for exemplary explanation. For instance, the guide structure 17 may be any other element or structure (such as linear guide track) for defining the linear path P.

The pivot lever 3 has a shaft 31 and an arm 33. The shaft 31 extends through the first lateral plate 13, the slider 5, the spring 7 and the second lateral plate 15 in sequence. The arm 33 has one end connected to the shaft 31 and the other end for connecting with the display device 3000 (as shown in FIGS. 8, 10 and 12). The shaft 31 is rotatably connected to the first lateral plate 13 and the second lateral plate 15 of the fixing seat 1. Further, a central axis X of the shaft 31 is parallel to the linear path P, and the slider 5 is sleeved on the shaft 31 and movably disposed on the guide structure 17 of the fixing seat 1. More specifically, the exterior surface of the shaft 31 is formed with two thread sets, wherein each of the thread sets is constituted by a first thread groove 311 and a second thread groove 313. The slider 5 has a first shell 51, a second shell 53, two first balls 55, two second balls 57 and a sleeve 59. The first shell 51 and the second shell 53 are engaged with each other and sleeved on the exterior surface of the shaft 31. The first balls 55 are set between the first shell 51 and the second shell 53, and movably disposed at the first thread grooves 311. Likewise, the second balls 57 are set between the first shell 51 and the second shell 53, and movably disposed at the second thread grooves 313. The sleeve 59 is sleeved at one end of the first shell 51 and one end of the second shell 53 to avoid separation between the first shell 51 and the second shell 53. The first guide rod 171 and the second guide rod 173 extend through the sleeve 59 to limit the linear movement of the slider 5 along the linear path P. Accordingly, when the display device 3000 is lifted or lowered, the arm 33 would pivot about the central axis X of the shaft 31 and cause synchronous rotary motion of the shaft 31, and the two first balls 55 and the two second balls 57 move along the two first thread grooves 311 and the two second thread grooves 313, respectively. As a result, the slider 5 would linearly move along the linear path P with respect to the shaft 31. In this embodiment, the two first thread grooves 311, the two second thread grooves 313, the two first balls 55 and the two second balls 57 are only provided for exemplary illustration. The quantity of the first thread grooves 311, the second thread grooves 313, the first balls 55 and the second balls 57 is not particularly limited, and can be modified according to requirement.

The spring 7 is sleeved on the shaft 31 and located between the slider 5 and the second lateral plate 15. Specifically, the spring 7 has a mobile end 71 abutting against the sleeve 59 of the slider 5 and an immobile end 73 abutting against the second lateral plate 15. During the displacement of the slider 5 along the linear path P, the mobile end 71 can move with the slider 5, whereas the immobile end 73 keeps stationary. As a result, the displacement of the slider 5 would cause different degrees of deformation of the spring 7, resulting in different spring resilience forces on the slider 5. Further, by the ball-screw transmission mechanism 60 constituted by the pivot lever 3 and the slider 5, the different spring resilience forces can be converted into different resistance torques to balance the downward torque caused by the weight of the display device 3000.

Figure 3:
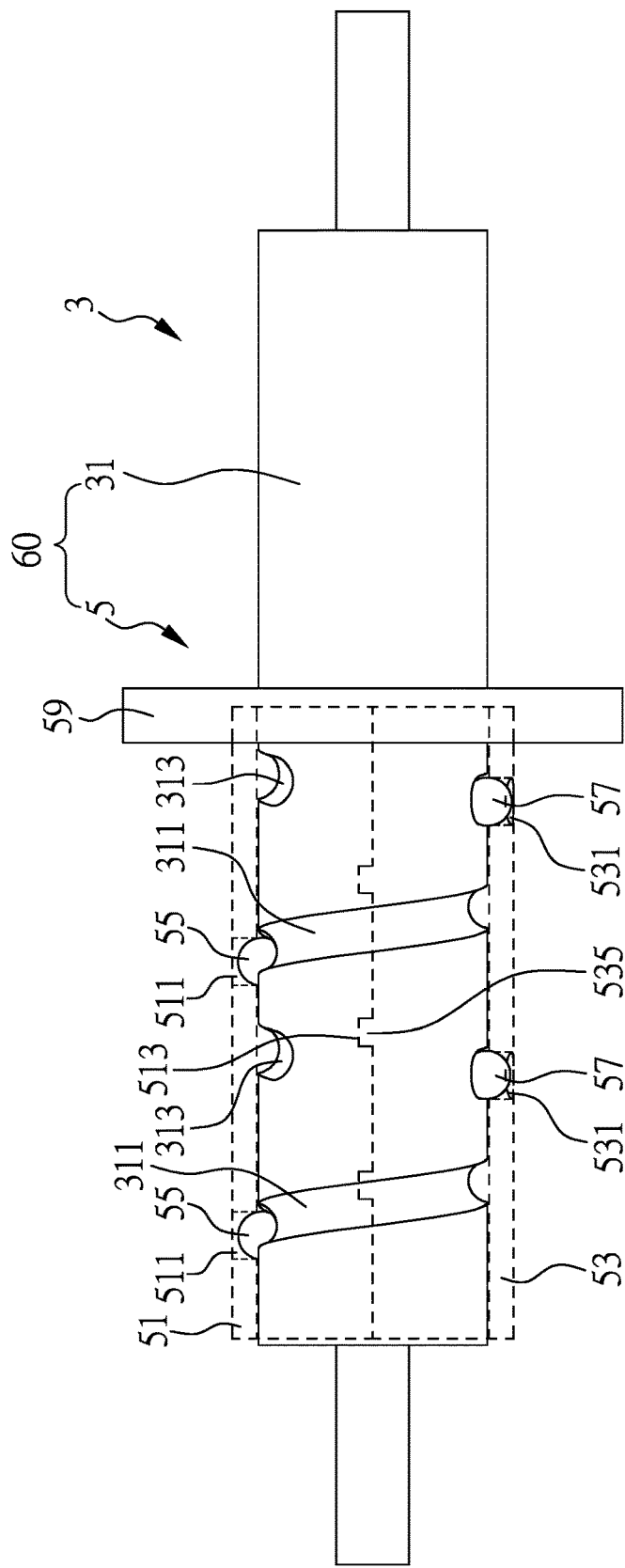
FIG. 3 is a top view of an assembly of a shaft and a slider in accordance with one embodiment of the present invention.
Figure 4:
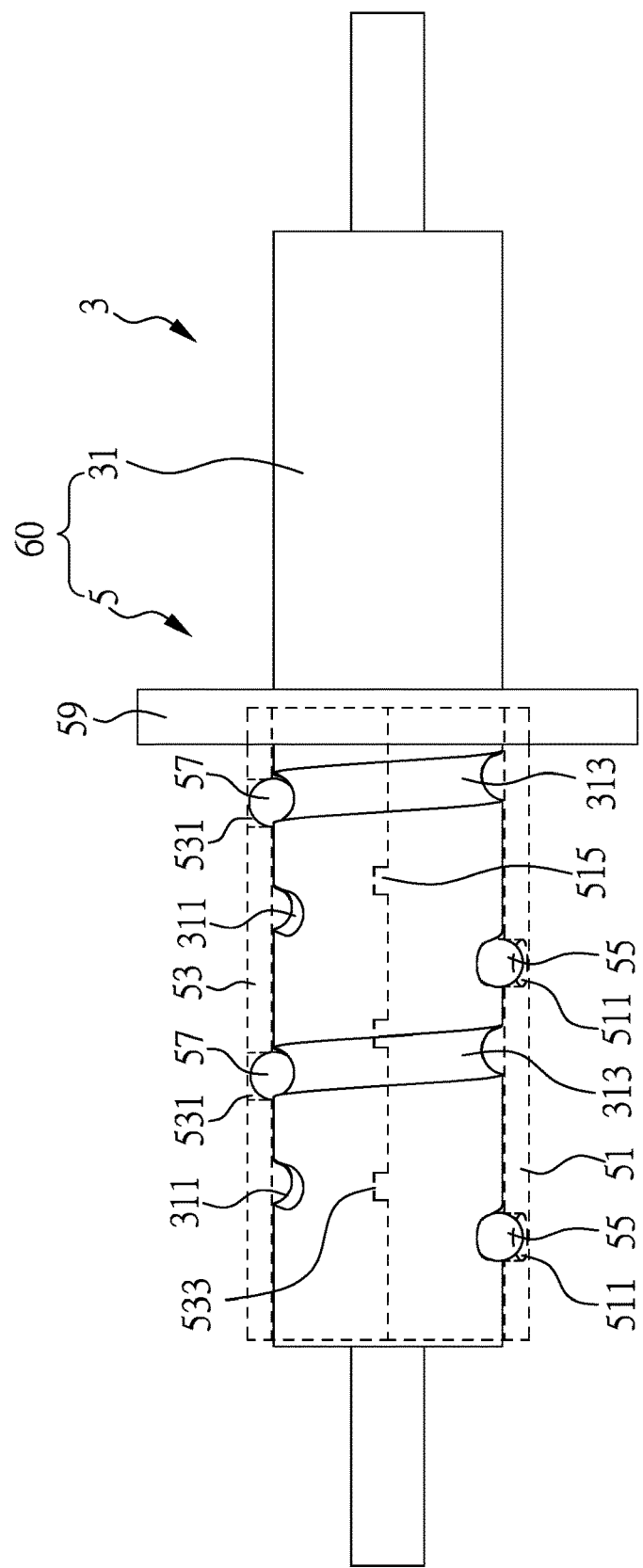
FIG. 4 is a bottom view of an assembly of a shaft and a slider in accordance with one embodiment of the present invention.

Attention is now directed to FIGS. 3 and 4, which are top and bottom views, respectively, of the shaft 31 and the slider 5 assembled with each other for details explanation of the ball-screw transmission mechanism 60 constituted by the shaft 31 and the slider 5. The first thread grooves 311 and the second thread grooves 313 may have the same threaded path. Further, starting ends of the first thread grooves 311 and the second thread grooves 313 are spaced apart from each other by 180 degrees in a circumferential direction. Likewise, the first balls 55 and the second balls 57 are spaced apart from each other by 180 degrees in a circumferential direction. The first shell 51 has two first holes 511 for the two first balls 55 inlaid therein, whereas the second shell 53 has two second holes 531 for the two second balls 57 inlaid therein. For alignment between the first shell 51 and the second shell 53, the first shell 51 may be formed with three first concave portions 513 and three first protruded portions 515 respectively along its two parallel sides, and the second shell 53 also is formed with three second concave portions 533 and three second protruded portions 535 respectively along its two parallel sides. Accordingly, when the first shell 51 and the second shell 53 are assembled with each other, the first concave portions 513 and the first protruded portions 515 of the first shell 51 are engaged with the second protruded portions 535 and the second concave portions 533 of the second shell 53, respectively, so as to avoid displacement between the first shell 51 and the second shell 53 during assembly.

Figure 5:
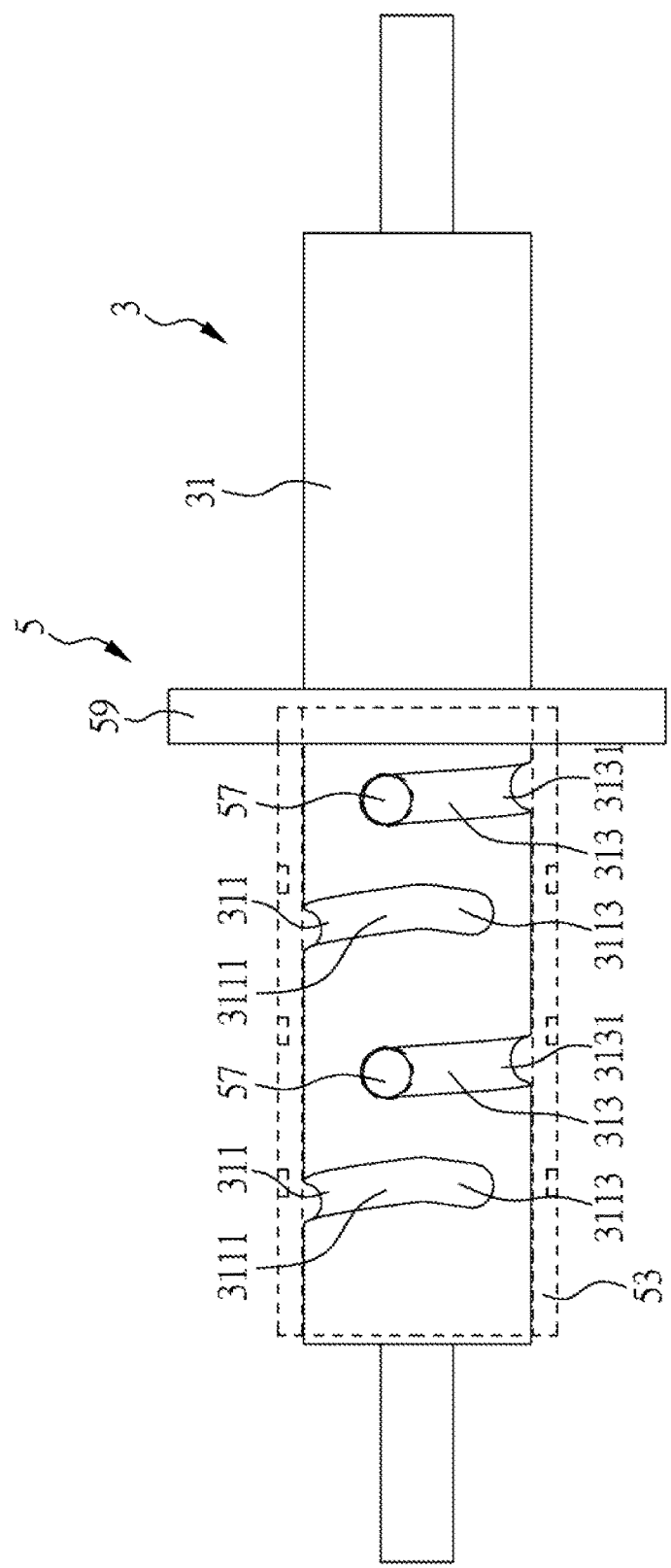
FIG. 5 is a side view of an assembly of a shaft and a slider in accordance with one embodiment of the present invention.
Figure 6:
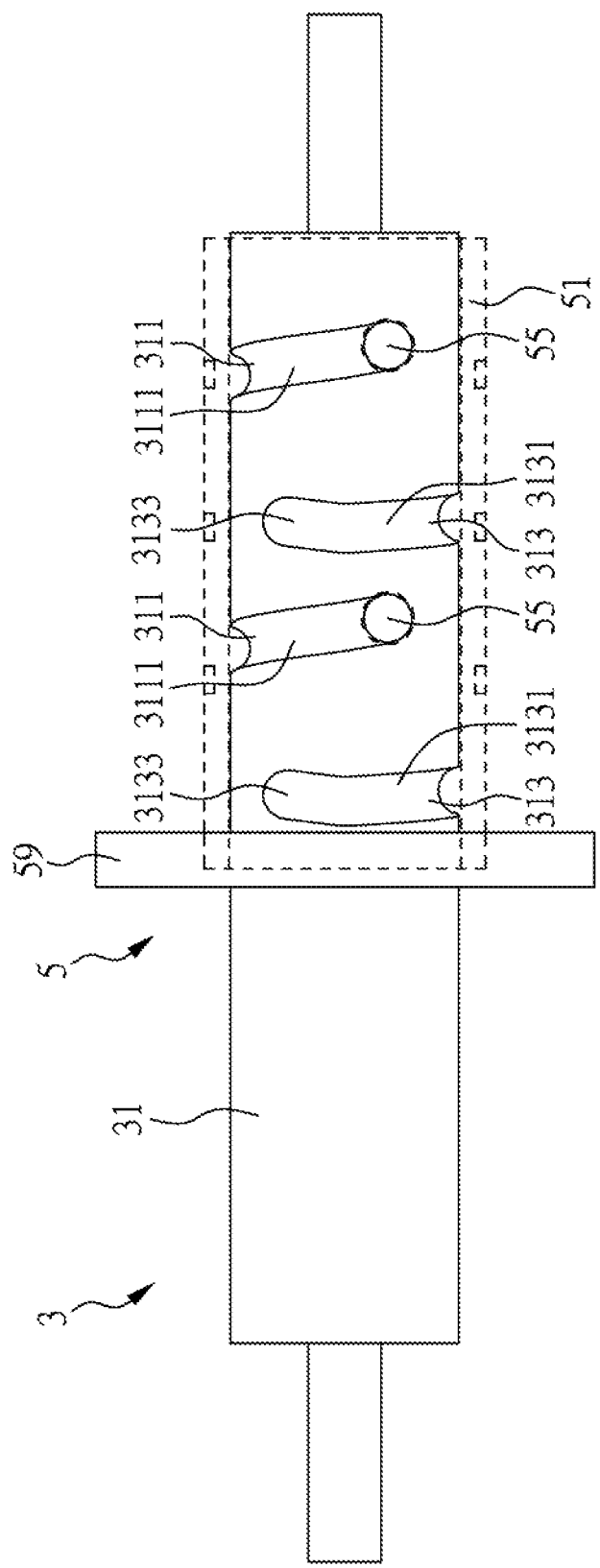
FIG. 6 is another side view of an assembly of a shaft and a slider in accordance with one embodiment of the present invention.

FIGS. 5 and 6 are side views, viewed from two opposite sides, of the assembly of the shaft 31 and the slider 5. For coordination with the variation of the gravity torque during lifting or lowering of the display device 3000, the first thread grooves 311 each have a main segment 3111 and a turning segment 3113, and the second thread grooves 313 each also have a main segment 3131 and a turning segment 3133. The thread direction of the main segments 3111, 3131 is opposite to that of the turning segments 3113, 3133. In other words, the joints between the main segments 3111, 3131 and the turning segments 3113, 3133 are the closest to the second lateral plate 15. When the first balls 55 and the second balls 57 are located at the joints between the main segments 3111, 3131 and the turning segments 3113, 3133, the arm 33 is in a horizontal state as shown in FIG. 10 (i.e. the display device 3000 being at a horizontal position). For balancing the maximum gravity torque due to the largest effective moment arm when the arm 33 is horizontal, the spring 7 is compressed to the largest degree of deformation so as to provide the maximum resistance torque.

Figure 7:
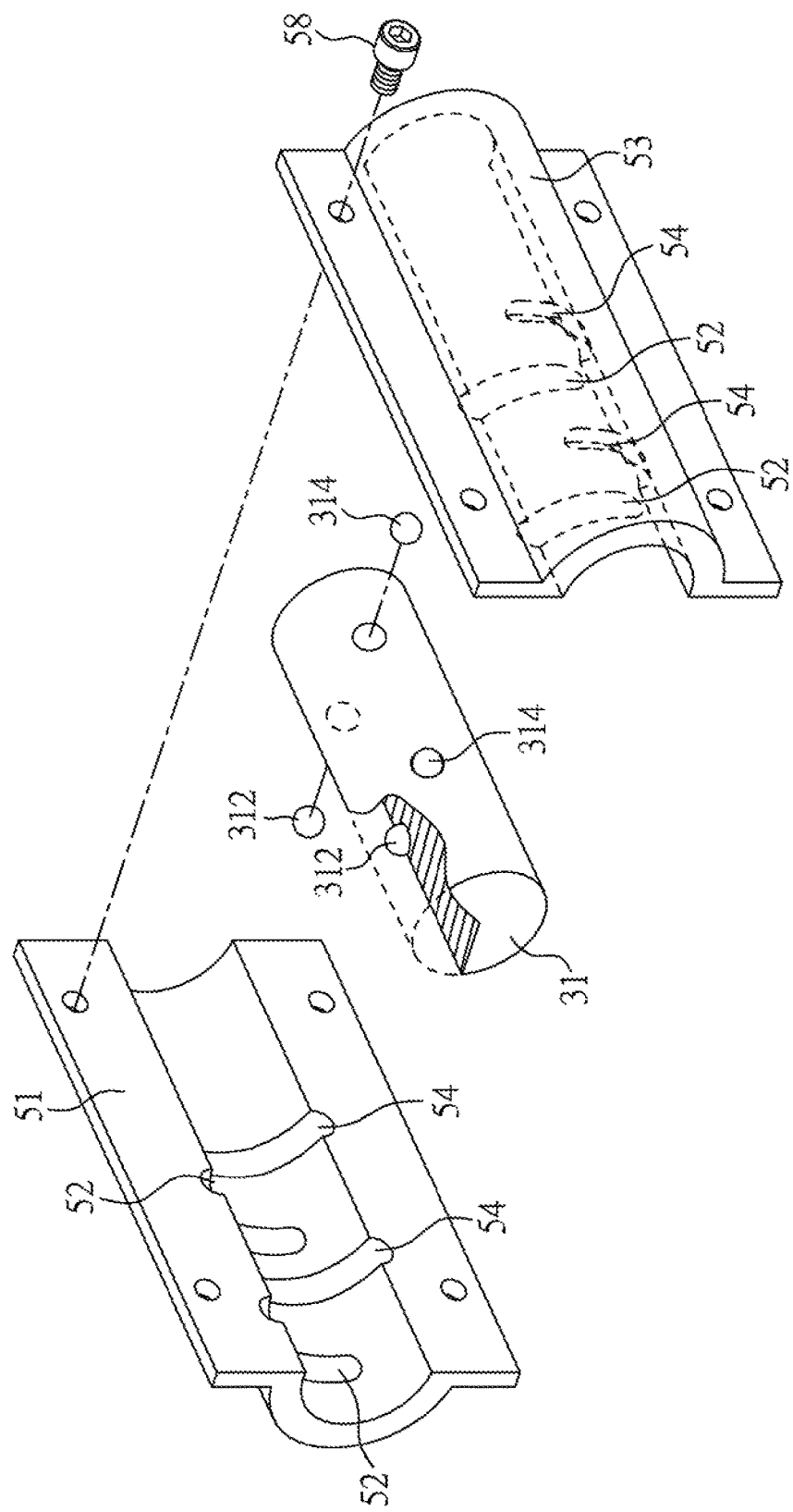
FIG. 7 is a perspective schematic view of an assembly of a shaft and a slider in accordance with another embodiment of the present invention.

FIG. 7 is a perspective schematic view of the assembly of the shaft 31 and the slider 5 in accordance with another embodiment of the present invention. Two opposite sides of the shaft 31 are provided with two first balls 312 and two second balls 314, respectively, and the interior surface of the slider 5 is formed with two first thread grooves 52 and two second thread grooves 54. As shown in FIG. 7, the slider 5 has a first shell 51 and a second shell 53. The interior surface of the first shell 51 is formed with a part of the first thread grooves 52 and the second thread grooves 54, whereas the interior surface of the second shell 53 is formed with the other part of the first thread grooves 52 and the second thread grooves 54. Accordingly, the first thread grooves 52 and the second thread grooves 54 extend across a joint boundary between the first shell 51 and the second shell 53. Additionally, in this embodiment, as the first shell 51 and the second shell 53 are affixed to each other by each two screws (for simplification, only one screw 58 is illustrated) at upper and lower sides thereof, the sleeve 59 illustrated above is able to be omitted.

Following description is provided for illustrating the variation of the gravity torque and the spring 7 when the display device 3000 is adjusted from a lifted position (as shown in FIG. 8) to the horizontal position (as shown in FIG. 10) and then to a lowered position (as shown in FIG. 12, minus angle).

Figure 9:
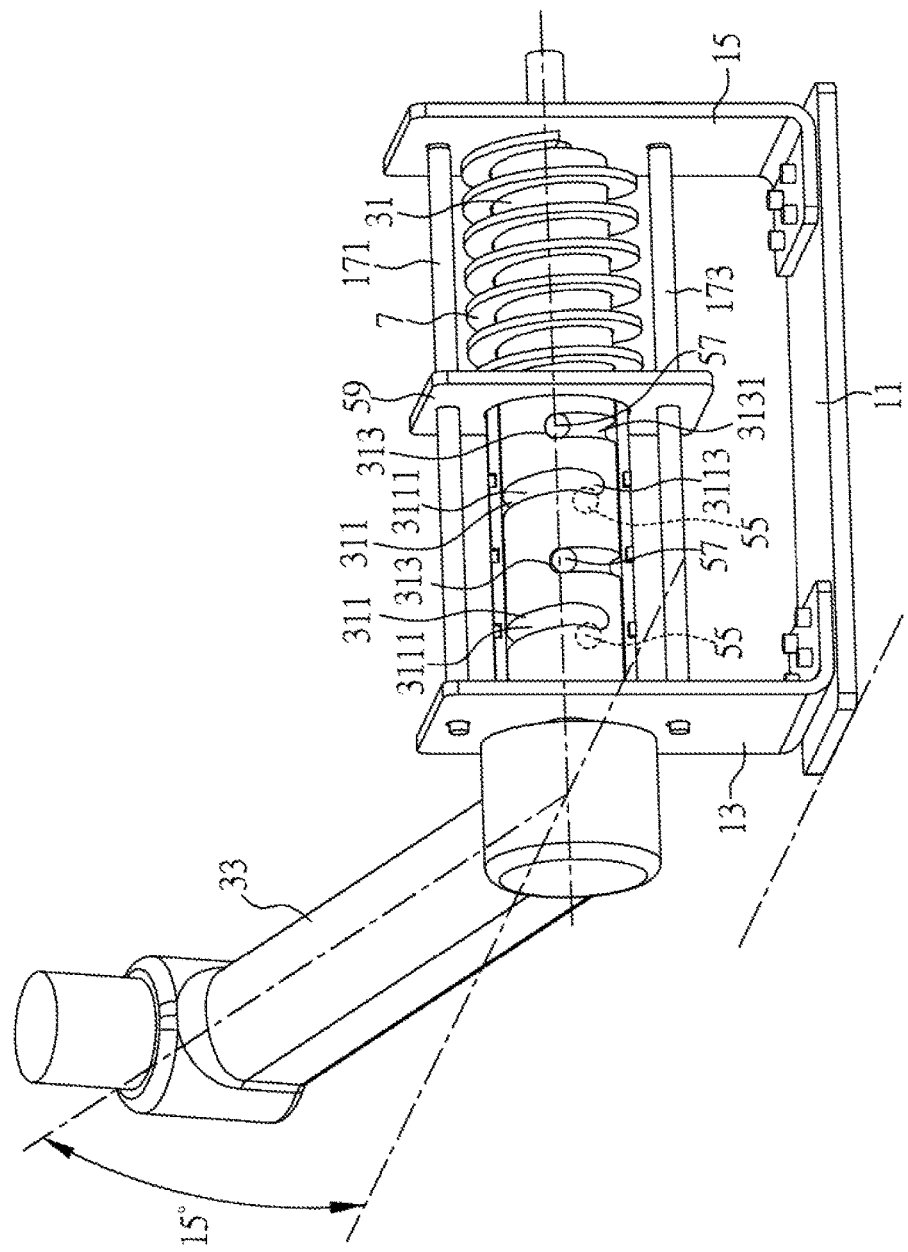
FIG. 9 is a perspective schematic view of the supporting module with the arm in the lifted state.

Please refer to FIGS. 8 and 9, which are a side view of the display device 3000 on the arm 33 adjusted to the highest position and a perspective schematic view of the supporting module 1000, respectively. When the display device 3000 is placed at the highest location, the first balls 55 and the second balls 57 are located at the starting ends of the main segments 3111, 3131 of the first thread grooves 311 and the second thread grooves 313, and the spring 7 is in a less compressed state.

Figure 11:
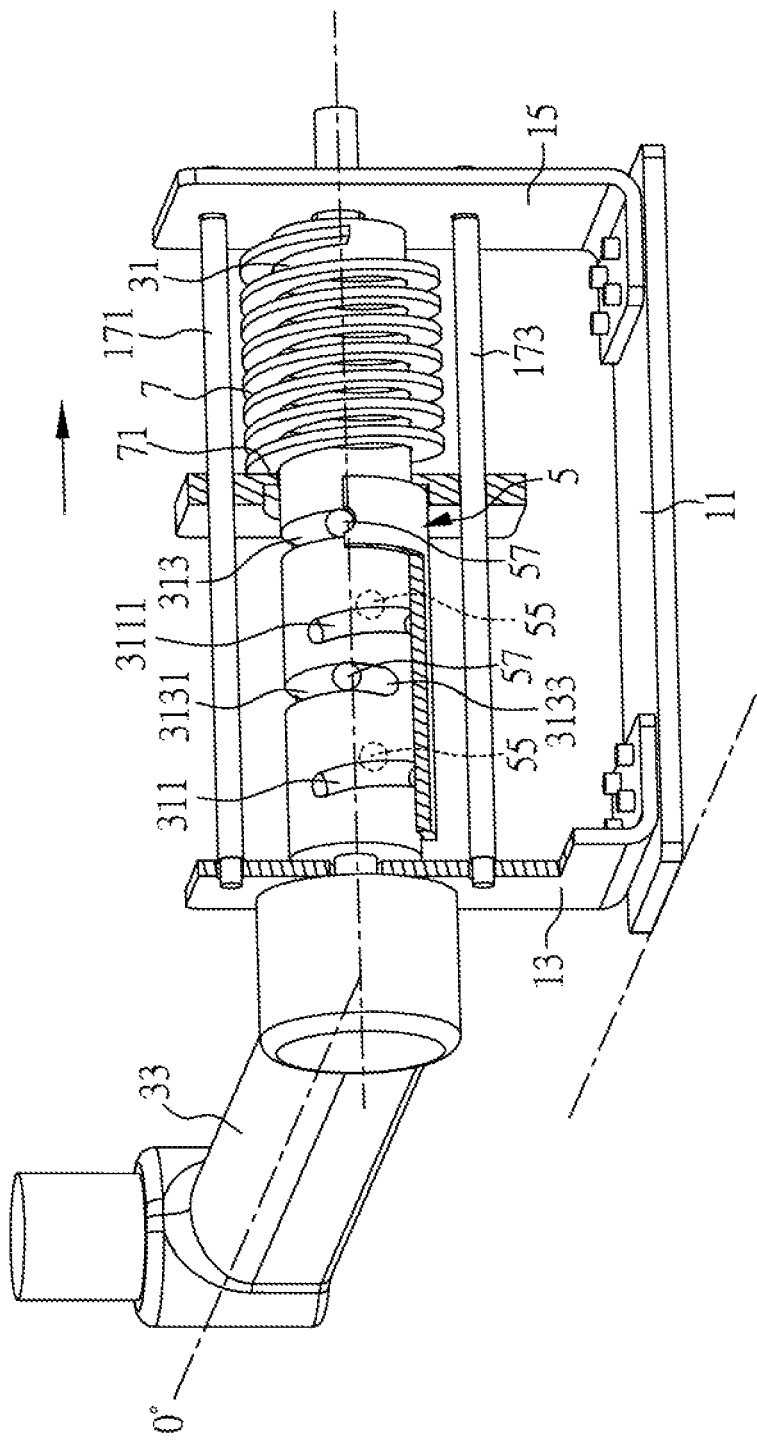
FIG. 11 is a perspective schematic view of the supporting module with the arm in the horizontal state.

Next, please refer to FIGS. 10 and 11, which are a side view of the display device 3000 on the arm 33 adjusted to the horizontal position and a perspective schematic view of the supporting module 1000, respectively. When the display device 3000 is downwardly pressed from the highest position to the horizontal position, the gradually arisen effective moment arm of the arm 33 would cause the gravity torque to increase, resulting in the maximum gravity torque at the horizontal position. Accordingly, the thread direction of the main segments 3111, 3131 of the first thread grooves 311 and the second thread grooves 313 is designed to that the main segments 3111, 3131 extend toward the second lateral plate 15 from the starting ends to terminal ends (i.e. the joints between the main segments 3111, 3131 and the turning segments 3113, 3133). Thereby, when the downwardly pivoted arm 33 causes screw motion of the shaft 31 with respect to the slider 5, the first balls 55 and the second balls 57 would move along the main segments 3111, 3131 of the first thread grooves 311 and the second thread grooves 313 toward the turning segments 3113, 3133 (p.s. the turning segments 3113 of the first thread grooves 311 cannot be shown in FIG. 11 due to the view angle limitation). Accordingly, the slider 5 can move toward the second lateral plate 15 according to the thread direction of the main segments 3111, 3131, and the mobile end 71 (abutting against the slider 5) of the spring 7 is compressed toward the second lateral plate 15 by the slider 5, resulting in increased compressive deformation of the spring 7. When the display device 3000 is adjusted to the horizontal position, the first balls 55 and the second balls 57 are located at the terminal ends of the main segments 3111, 3131 and adjacent to the turning segments 3113, 3133, respectively, and the spring 7 has maximum compressive deformation. As a result, by the varied helix angle of the main segments 3111, 3131, the spring 7 can provide non-linearly increasing elastic force when the arm 33 is pivoted from a lifted state to the horizontal state so as to balance with the non-linearly increasing gravity torque caused by the display device 3000.

Figure 13:
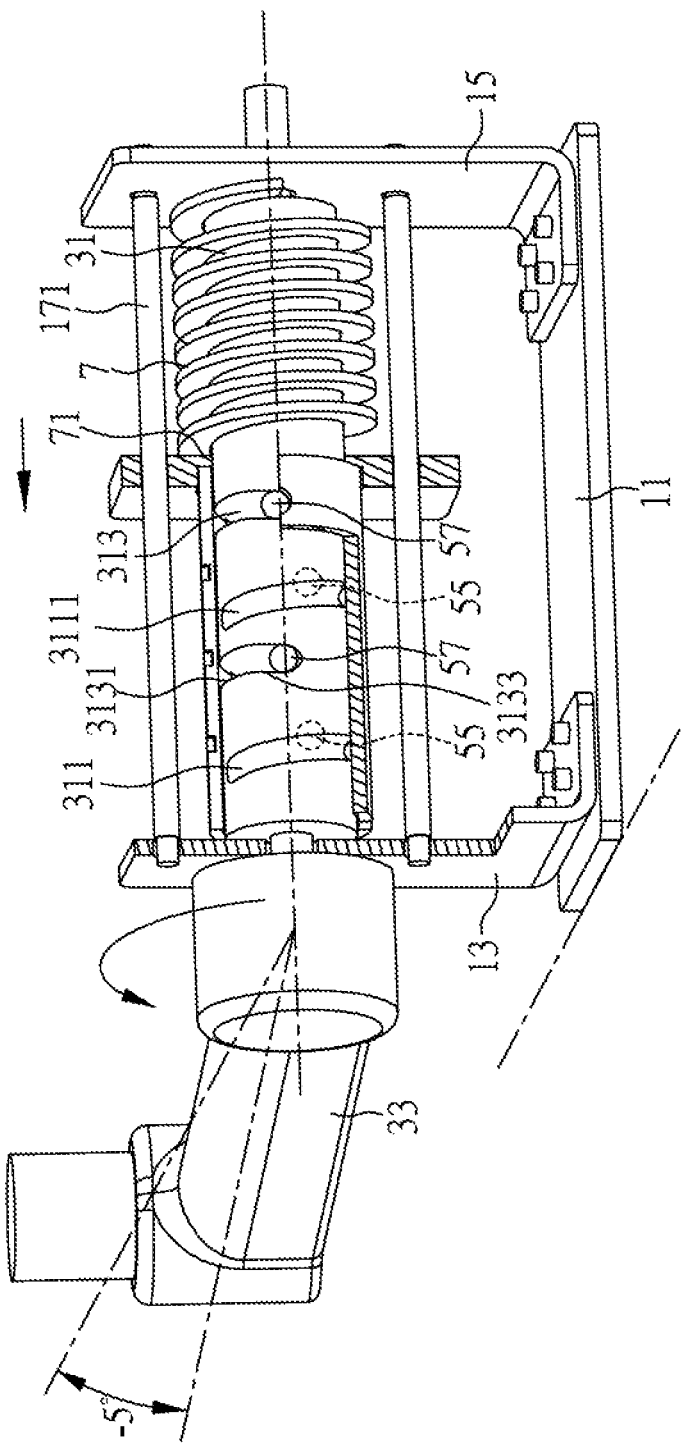
FIG. 13 is a perspective schematic view of the supporting module with the arm in the lowered state.

Finally, please refer to FIGS. 12 and 13, which are a side view of the display device 3000 on the arm 33 adjusted to the lowered position and a perspective schematic view of the supporting module 1000, respectively. When the display device 3000 is further downwardly adjusted from the horizontal position to the lowered position, the gradually reduced effective moment arm of the arm 33 would cause the gravity torque to decrease. Accordingly, the thread direction of the turning segments 3113, 3133 of the first thread grooves 311 and the second thread grooves 313 is designed to that the turning segments 3113, 3133 extend away from the second lateral plate 15 from the starting ends (i.e. the joints between the main segments 3111, 3131 and the turning segments 3113, 3133) to the terminal ends. Thereby, when the first balls 55 and the second balls 57 move to the turning segments 3113, 3133 from the main segments 3111, 3131 of the first thread grooves 311 and the second thread grooves 313 (p.s. the turning segments 3113 of the first thread grooves 311 cannot be shown in FIG. 13 due to the view angle limitation) and move along the turning segments 3113, 3133, the slider 5 would turn to move toward the first lateral plate 13 according to the thread direction of the turning segments 3113, 3133 is opposite to that of the main segments 3111, 3131. Along with the displacement of the slider 5 toward the first lateral plate 13, the mobile end 71 (abutting against the slider 5) of the spring 7 would move toward the first lateral plate 13 through the spring resilience force, resulting in the decreased compressive deformation of the spring 7. When the display device 3000 is adjusted to the lowest position, the first balls 55 and the second balls 57 are located at the terminal ends of the turning segments 3113, 3133. Likewise, by the varied helix angle of the turning segments 3113, 3133, the spring 7 can provide non-linearly decreasing elastic force when the arm 33 is pivoted from the horizontal state to the lowered position so as to balance with the non-linearly decreasing gravity torque caused by the display device 3000.

Therefore, during the pivot motion of the arm 33 from the lifted state to a lowered state, the spring 7 would be gradually compressed to reach the maximum compressive deformation when the arm 33 is pivoted to be horizontal, followed by being gradually relaxed. The aforementioned operation range of the arm 33 between the 15° lifted-up position and −5° lowered-down position is only provided for exemplary explanation, and the supporting module of the present invention is not limited thereto. Lifting and lowering limits of the arm 33 may be varied according to practical requirement.

In brief, when the arm of the supporting module in accordance with the present invention is operated from the lifted state to the horizontal state, the downward torque caused by the weight of the display device would non-linearly increase due to the arisen effective moment arm, and the spring provides non-linearly increasing resistance torque according to the varied helix angle of the screw transmission mechanism. On the contrary, when the arm is operated from the horizontal state to the lowered state, the downward torque caused by the weight of the display device would non-linearly decrease due to the reduced effective moment arm, and the spring provides non-linearly decreasing resistance torque. Accordingly, the supporting module of the present invention can provide appropriate supporting force in coordination with the variation of the gravity torque of the display device. Therefore, the downward torque caused by the display device can be completely balanced to make the display device stop at any desired height.

The above examples are intended for illustrating the embodiments of the subject invention and the technical features thereof, but not for restricting the scope of protection of the subject invention. Many other possible modifications and variations can be made without departing from the spirit and scope of the invention as hereinafter claimed. The scope of the subject invention is based on the claims as appended.

What is claimed is:

1. A supporting module for a display device, the supporting module comprising:
   a fixing seat, having a guide structure, wherein the guide structure defines a linear path;
   a pivot lever, having a shaft and an arm, wherein (i) the shaft is rotatably connected to the fixing seat and has a central axis parallel to the linear path, (ii) the arm is connected to the shaft and used for mounting the display device, and (iii) the arm is configured to be pivotable about the central axis of the shaft and capable of bringing the shaft into synchronous rotary motion;
   a slider, being sleeved on the shaft, wherein (i) the slider and the shaft constitute a screw transmission mechanism with a varied helix angle, (ii) the slider is brought into linear movement along the linear path with respect to the shaft when the arm is forced to induce rotary motion of the shaft, and (iii) the linear movement of the slider depends on axial displacement corresponding to the varied helix angle; and
   a spring, having a mobile end and an immobile end, wherein the mobile end is movable with the slider, and the mobile end moves with the slider and the immobile end keeps stationary when the slider moves along the linear path, so that the displacement of the slider causes different degrees of deformation of the spring, resulting in different spring resilience forces on the slider, and the different spring resilience forces are further converted into different resistance torques through the screw transmission mechanism so as to stop the display device at any desired height.

2. The supporting module of claim 1, wherein the screw transmission mechanism is a ball-screw transmission mechanism.

3. The supporting module of claim 2, wherein (i) one of the shaft and the slider is formed with at least one first thread groove and at least one second thread groove, whereas the other is provided with at least one first ball and at least one second ball, (ii) the at least one first thread groove and the at least one second thread groove have a same thread path, and (iii) when the shaft rotates, the at least one first ball and the at least one second ball move along the at least one first thread groove and the at least one second thread groove, respectively.

4. The supporting module of claim 3, wherein (i) the slider has a first shell, a second shell, the at least one first ball and the at least one second ball, (ii) the first shell and the second shell are engaged with each other and sleeved on the shaft, and (iii) the at least one first ball is set at the first shell, whereas the at least one second ball is set at the second shell.

5. The supporting module of claim 3, wherein (i) when the slider is formed with the at least one first thread groove and at least one second thread groove, the slider has a first shell, a second shell and an interior surface formed with the at least one first thread groove and the at least one second thread groove, (ii) the first shell and the second shell are engaged with each other and sleeved on the shaft, and (iii) the at least one first thread groove and the at least one second thread groove extend across a joint boundary between the first shell and the second shell.

6. The supporting module of claim 1, wherein the guide structure of the fixing seat includes a first guide rod and a second guide rod, and the first guide rod and the second guide rod extend through the slider along a direction parallel to the central axis of the shaft to permit linear movement of the slider along the first guide rod and the second guide rod.

7. The supporting module of claim 3, wherein starting ends of the first thread groove and the second thread groove are spaced apart from each other by 180 degrees in a circumferential direction, and the at least one first ball and the at least one second ball are spaced apart from each other by 180 degrees in the circumferential direction.

8. The supporting module of claim 3, wherein each of the at least one first thread groove and the at least one second thread groove has a main segment and a turning segment, and the turning segment have a thread direction opposite to that of the main segment.

9. The supporting module of claim 8, wherein the slider linearly moves according to the main segments when the arm is adjusted between a lifted state and a horizontal state, and the slider linearly moves according to the turning segments when the arm is adjusted between the horizontal state and a lowered state.

10. The supporting module of claim 4, wherein the slider further has a sleeve which is sleeved on the first shell and the second shell.

11. The supporting module of claim 1, wherein angle variation of the varied helix angle corresponds with gravity torque variation caused by lifting or lowering of the display device so as to make an elastic force provided by the spring balance with the gravity torque caused by the display device.

12. The supporting module of claim 1, wherein the deformation of the spring is gradually increasing when the arm is pivoted from a lifted state to a horizontal state, and the deformation of the spring is gradually decreasing when the arm is pivoted from a horizontal state to a lowered state.

13. The supporting module of claim 1, wherein the spring is a compression spring.

14. The supporting module of claim 1, wherein (i) the fixing seat further has a base plate, a first lateral plate and a second lateral plate, (ii) the first lateral plate and the second lateral plate are fastened and erected on the base plate, and (iii) the shaft extends through the first lateral plate, the slider, the spring and the second lateral plate in sequence.

* * * * *